(12) United States Patent
Do et al.

(10) Patent No.: US 11,869,920 B2
(45) Date of Patent: Jan. 9, 2024

(54) ULTRA-SMALL LED ELECTRODE ASSEMBLY HAVING IMPROVED LUMINANCE AND METHOD OF MANUFACTURING THE SAME

(71) Applicant: Samsung Display Co., Ltd., Yongin-si (KR)

(72) Inventors: Young Rag Do, Seoul (KR); Yun Jae Eo, Seoul (KR); Yeon Goog Sung, Goyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/543,544

(22) Filed: Dec. 6, 2021

(65) Prior Publication Data

US 2022/0093676 A1 Mar. 24, 2022

Related U.S. Application Data

(63) Continuation of application No. 16/518,901, filed on Jul. 22, 2019, now Pat. No. 11,195,877, which is a continuation of application No. 15/705,284, filed on Sep. 15, 2017, now Pat. No. 10,361,246.

(51) Int. Cl.
| | |
|---|---|
| *H01L 27/15* | (2006.01) |
| *H01L 33/64* | (2010.01) |
| *H01L 33/60* | (2010.01) |
| *H01L 25/075* | (2006.01) |
| *H01L 33/36* | (2010.01) |
| *H01L 33/00* | (2010.01) |
| *H01L 33/62* | (2010.01) |

(52) U.S. Cl.
CPC ........ *H01L 27/153* (2013.01); *H01L 25/0753* (2013.01); *H01L 33/60* (2013.01); *H01L 33/644* (2013.01); *H01L 33/0095* (2013.01); *H01L 33/36* (2013.01); *H01L 33/62* (2013.01); *H01L 2933/0066* (2013.01)

(58) Field of Classification Search
None
See application file for complete search history.

(56) References Cited

U.S. PATENT DOCUMENTS

| 10,910,512 B2 * | 2/2021 | Sung | H01L 33/38 |
| 10,964,842 B2 * | 3/2021 | Sung | H01L 33/24 |
| 2018/0287010 A1 * | 10/2018 | Sung | H01L 33/007 |

FOREIGN PATENT DOCUMENTS

| KR | 20090121743 A | 11/2009 |
| KR | 101429095 B1 | 8/2014 |
| KR | 101490758 B1 | 2/2015 |
| KR | 20160059569 | 5/2016 |
| KR | 101627365 B1 | 6/2016 |

* cited by examiner

*Primary Examiner* — Long Pham
(74) *Attorney, Agent, or Firm* — Lewis Roca Rothgerber Christie LLP

(57) ABSTRACT

An ultra-small light-emitting diode (LED) electrode assembly having an improved luminance is provided. More particularly, an ultra-small LED electrode assembly in which light, which is blocked by an electrode and cannot be extracted, is minimized, an ultra-small LED device is connected to an ultra-small electrode without a defect such as an electrical short-circuit, and a very excellent luminance is exhibited even at a direct current (DC) driving voltage, and a method of manufacturing the same are provided.

14 Claims, 9 Drawing Sheets

ULTRA-SMALL LED ELECTRODE ASSEMBLY HAVING IMPROVED LUMINANCE AND METHOD OF MANUFACTURING THE SAME

CROSS-REFERENCE TO RELATED APPLICATIONS

This application is a continuation of U.S. patent application Ser. No. 16/518,901, filed Jul. 22, 2019, which is a continuation of U.S. patent application Ser. No. 15/705,284, filed Sep. 15, 2017, now U.S. Pat. No. 10,361,246, the entire content of all of which is incorporated herein by reference.

TECHNICAL FIELD

The present invention relates to an ultra-small light-emitting diode (LED) electrode assembly, and more particularly, to an ultra-small LED electrode assembly in which light, which is blocked by an electrode and cannot be extracted, is minimized, an ultra-small LED device is connected to an ultra-small electrode without a defect such as an electrical short-circuit, and a very excellent luminance is exhibited even at a direct current (DC) driving voltage, and a method of manufacturing the same.

BACKGROUND

Light-emitting diode (LED) devices have been actively developed since Nakamura and the like of Nichia Corporation of Japan succeeded in fusing a high-quality monocrystalline GaN nitride semiconductor in 1992 by applying a low-temperature GaN compound buffer layer thereto. An LED is a semiconductor having a structure in which an N-type semiconductor crystal in which a plurality of carriers are electrons and a P-type semiconductor crystal in which a plurality of carriers are holes are bonded to each other by using a characteristic of a compound semiconductor, and is a semiconductor device which converts an electrical signal into light having a wavelength band of a desired region to display the light. In Korea Unexamined Patent Application Publication No. 2009-0121743, a method of manufacturing an LED and an LED manufactured thereby are disclosed.

The LED is a green component which has very low energy consumption due to high light conversion efficiency, has a semi-permanent lifetime, and is environmentally friendly. LEDs are being applied in many fields such as traffic lights, mobile phones, automobile headlights, outdoor electric signboards, liquid-crystal display (LCD) backlight units (BLUs), indoor/outdoor lights, and the like, and are being actively researched domestically and internationally.

As part of the above research, research on an ultra-small LED device which is manufactured to have a nano size or a micro size is actively being conducted, and research for utilizing such an ultra-small LED device in lighting, a display, and the like is being continued. In such research, an electrode for applying power to an ultra-small LED device, an electrode arrangement for reducing a space occupied by the electrode and an application purpose, a method of mounting an ultra-small LED on an arranged electrode, and the like are continuously being focused on.

Among the above things, the method of mounting an ultra-small LED on an arranged electrode still has difficulty in that it is very difficult to arrange and mount an ultra-small LED device on a target electrode due to a size limitation of the ultra-small LED device. This is because the ultra-small LED device is on a nano-scale or micro-scale and may not be arranged and mounted in a target electrode region by a human hand.

Also, even when the ultra-small LED device is mounted in the target electrode region, it is very difficult to adjust the number of ultra-small LED devices included in a unit electrode region and a positional relationship between ultra-small LED devices and electrodes as desired. When LED devices are arranged on a two-dimensional plane, the number of LED devices included in a unit area is limited and it is difficult to obtain an excellent amount of light. Furthermore, because all ultra-small LED devices connected to two different electrodes cannot emit light without a defect such as an electrical short-circuit and the like, it is more difficult to obtain a desired amount of light.

Accordingly, the inventor of the present invention has proposed a method of manufacturing a nano-scaled ultra-small LED device which is implemented as an electrode assembly by applying power to the ultra-small electrode line in Korean Patent Registration No. 10-1490758 to implement an ultra-small LED electrode assembly. However, in the ultra-small LED electrode assembly implemented by such a technique, the number of ultra-small LED devices which do not emit light when a DC is applied thereto as driving power is significantly increased, and thus it is difficult to obtain a desired luminance. In order to address the above problem, there is a selection limitation of power to which an alternating current (AC) should be applied as the driving power. Such results are due to characteristics of the LED itself as a rectifier. A direction of a current in a device may be determined by a structure of layers in the device. For example, in the case of an LED in which a P-type semiconductor and an N-type semiconductor are bonded to each other, when positive (+) power is connected to the P-type semiconductor and negative (−) power is connected to the N-type semiconductor, a current may flow through the LED due to a potential difference generated while free electrons of the N-type semiconductor move toward positive holes of the P-type semiconductor, and the LED may emit light while the free electrons recombine with the positive holes. However, since no current flows in the LED when the negative (−) power is connected to the P-type semiconductor and the positive (+) power is connected to the N-type semiconductor, an ultra-small LED electrode assembly implemented to have no semiconductor directionality of ultra-small LED devices and no disposition tendency between different mounting electrodes has a problem in that some of the ultra-small LED devices may not emit light when DC driving power is applied thereto and a luminance thereof is significantly reduced.

Accordingly, research on an ultra-small LED electrode assembly in which ultra-small LED devices communicate without an electrical short-circuit, a selection limitation of driving power is removed, and a luminance thereof is further improved is urgently required.

SUMMARY OF THE INVENTION

The present invention is directed to an ultra-small light-emitting diode (LED) electrode assembly in which light, which is blocked by an electrode and cannot be extracted, is minimized and an ultra-small LED device is connected to an ultra-small electrode without a defect such as an electrical short-circuit, and a method of manufacturing the same.

The present invention is directed to an ultra-small LED electrode assembly in which a selection limitation of driving power of the ultra-small LED electrode assembly is removed and a luminance characteristic is sufficiently exhibited even through direct current (DC) driving power, and a method of manufacturing the same.

The present invention is directed to an ultra-small LED electrode assembly in which a luminance characteristic is sufficiently exhibited through DC driving power and is more improved than that of a conventional ultra-small LED electrode assembly, and a method of manufacturing the same.

The present invention is directed to a backlight unit (BLU) in which an excellent luminance characteristic can be exhibited through the ultra-small LED electrode assembly according to the present invention, and a display including the same.

The present invention is directed to a lamp in which an excellent luminance characteristic can be exhibited, and an intensity of light for a desired specific color is improved through the ultra-small LED electrode assembly according to the present invention.

According to an aspect of the present invention, there is provided a method of manufacturing an ultra-small LED electrode assembly having an improved luminance including (1) a step of introducing a solution including a plurality of ultra-small LED devices to an electrode line including a first mounting electrode and a second mounting electrode which is formed on the same plane as the first mounting electrode to be spaced apart from the first mounting electrode and (2) a step of applying power having an asymmetric assembly voltage of 10 V or more according to the following Equation 1 to the electrode line and self-mounting the plurality of ultra-small LED devices such that ends of each of the ultra-small LED devices come into contact with the first mounting electrode and the second mounting electrode, $$\text{Asymmetric assembly voltage }(V) = |A(V)| - |B(V)| \quad \text{[Equation 1]}$$

wherein A and B denote magnitudes of an upper peak voltage of applied power and a lower peak voltage of the applied power, respectively.

The power may have a frequency of 50 kHz to 1 GHz.

The power may have an asymmetric assembly voltage of 18 V or more according to the above Equation 1.

The power may have an effective voltage ($V_{rms}$) of 12 V or more.

The method may further include (3) a step of performing heat treatment at a temperature of 200 to 1,000° C. for 0.5 to 10 minutes on the electrode line and the ultra-small LED devices self-mounted on the electrode line after performing the step (2).

The method may further include a step of forming an ohmic layer at the ends of each of the ultra-small LED devices which come into contact with the first mounting electrode and the second mounting electrode after performing the step (2).

The power may have an asymmetric assembly voltage of 25 V or more according to the above Equation 1.

According to another aspect of the present invention, there is provided an ultra-small LED electrode assembly having an improved luminance including an electrode line including a first mounting electrode and a second mounting electrode which are formed on the same plane and spaced apart from each other, and a plurality of ultra-small LED devices each having one end in contact with the first mounting electrode and the other end in contact with the second mounting electrode, wherein a luminance gain according to the following Equation 2 is 1.1 or more, $$\text{Luminance gain} = \frac{\text{Luminance of ultra-small LED electrode assembly driven by DC voltage }(cd/m^3)}{\text{Luminance of ultra-small LED electrode assembly driven by AC voltage }(cd/m^3)} \quad \text{[Equation 2]}$$

wherein a magnitude of the applied DC voltage (V) is the same as an effective voltage ($V_{rms}$) of AC power having a sine waveform.

An aspect ratio of the ultra-small LED devices may range from 1.2 to 100. The ultra-small LED devices each may have a length 100 nm to 10 μm.

Each of the ultra-small LED devices may include a first conductive semiconductor layer, an active layer formed on the first conductive semiconductor layer, a second conductive semiconductor layer formed on the active layer, and an insulating film configured to cover at least an entire outer surface of an active layer portion of outer surfaces of the devices. In this case, any one of the first conductive semiconductor layer and the second conductive semiconductor layer may include at least one N-type semiconductor layer and the other conductive semiconductor layer may include at least one P-type semiconductor layer.

The ultra-small LED electrode assembly may have a luminance gain of 1.3 or more according to the above Equation 2.

The ultra-small LED electrode assembly may include 1,000 or more ultra-small LED devices mounted per unit area ($mm^2$).

The ultra-small LED electrode assembly may further include an insulating film formed on outer surfaces of the first mounting electrode and the second mounting electrode and the plurality of ultra-small LED devices may come into contact with the first mounting electrode and the second mounting electrode through the insulating film.

According to still another aspect of the present invention, there is provided an ultra-small LED electrode assembly having an improved luminance including an electrode line including a first mounting electrode and a second mounting electrode which are formed on the same plane and spaced apart from each other, and a plurality of ultra-small LED devices each including a first semiconductor and a second semiconductor, and each having one end in contact with the first mounting electrode and the other end in contact with the second mounting electrode, wherein the number of the ultra-small LED devices in which the first semiconductor comes into contact with the first mounting electrode is 60% or more of the total number of the ultra-small LED devices.

The number of the ultra-small LED devices in which first semiconductor comes into contact with the first mounting electrode may be 80% or more of the total number of the ultra-small LED devices.

The ultra-small LED electrode assembly may further include an insulating film formed on outer surfaces of the first mounting electrode and the second mounting electrode and the plurality of ultra-small LED devices may come into contact with the first mounting electrode and the second mounting electrode through the insulating film.

According to yet another aspect of the present invention, there is provided a BLU unit including the ultra-small LED electrode assembly according to the present invention.

According to yet another aspect of the present invention, there is provided a lamp including the ultra-small LED electrode assembly according to the present invention.

Hereinafter, terms used in the present invention will be described.

In embodiments according to the present invention, a "mounting electrode" refers to an electrode which comes into direct contact with each of both ends of an ultra-small LED device. A power source may be directly connected to the mounting electrode to drive an ultra-small LED electrode assembly, and an address electrode or a gate electrode which applies power to the mounting electrode may be further provided.

In the embodiments according to the present invention, when a layer, a region, a pattern, or a structure is described as being formed "on," "on an upper portion of," "above," "under," "on a lower portion of," or "below" a substrate, the description of the layer, the region, the pattern, or the structure includes the meaning of "directly formed" and "indirectly formed."

In the embodiments according to the present invention, when a "first component" is described as coming into contact with a "second component," the description includes the meaning of the first component and the second component coming into direct contact with each other or being indirectly structurally connected through a third component. For example, the phrase "a first conductive semiconductor coming into contact with a first mounting electrode" includes the meaning of the first mounting electrode being directly structurally connected to the first conductive semiconductor and the meaning of an electrode layer being formed on the first conductive semiconductor, the electrode layer and the first mounting electrode being structurally connected to each other, and the first mounting electrode being indirectly connected to the first conductive semiconductor. Meanwhile, the structural connection does not refer to an electrical connection related to whether an ultra-small LED device emits light when driving power is applied to an electrode line, and includes all physical contact even when the electrical connection is not established.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIGS. 1A to 1C are views of an ultra-small light-emitting diode (LED) electrode assembly according to one embodiment of the present invention, wherein FIG. 1A is a perspective view of the ultra-small LED electrode assembly, FIG. 1B is a luminescent photograph when alternating current (AC) power is applied to the ultra-small LED electrode assembly as driving power, and FIG. 1C is a luminescent photograph when direct current (DC) power is applied to the ultra-small LED electrode assembly as driving power;

FIGS. 2A to 2C are views of an ultra-small LED electrode assembly manufactured by a conventional method, wherein FIG. 2A is a perspective view of the ultra-small LED electrode assembly, FIG. 2B is a luminescent photograph when AC power is applied to the ultra-small LED electrode assembly as driving power, and FIG. 2C is a luminescent photograph when DC power is applied to the ultra-small LED electrode assembly as driving power;

FIGS. 4A to 4C are schematic views illustrating electrostatic attraction between an ultra-small LED device and a mounting electrode under an electric field, wherein FIG. 4A is a schematic view illustrating the case before power is applied to the mounting electrode, FIG. 4B is a schematic view illustrating the case in which symmetrical assembly power is applied to the mounting electrode, and FIG. 4C is a schematic view illustrating the case in which asymmetrical assembly power is applied to the mounting electrode;

FIGS. 7A and 7B are views of an ultra-small LED electrode assembly according to one embodiment of the present invention, wherein FIG. 7A is a luminescent photograph when AC power is applied to the ultra-small LED electrode assembly as driving power and FIG. 7B is a luminescent photograph when DC power is applied to the ultra-small LED electrode assembly as driving power.

DETAILED DESCRIPTION OF THE INVENTION

Figure 1A:
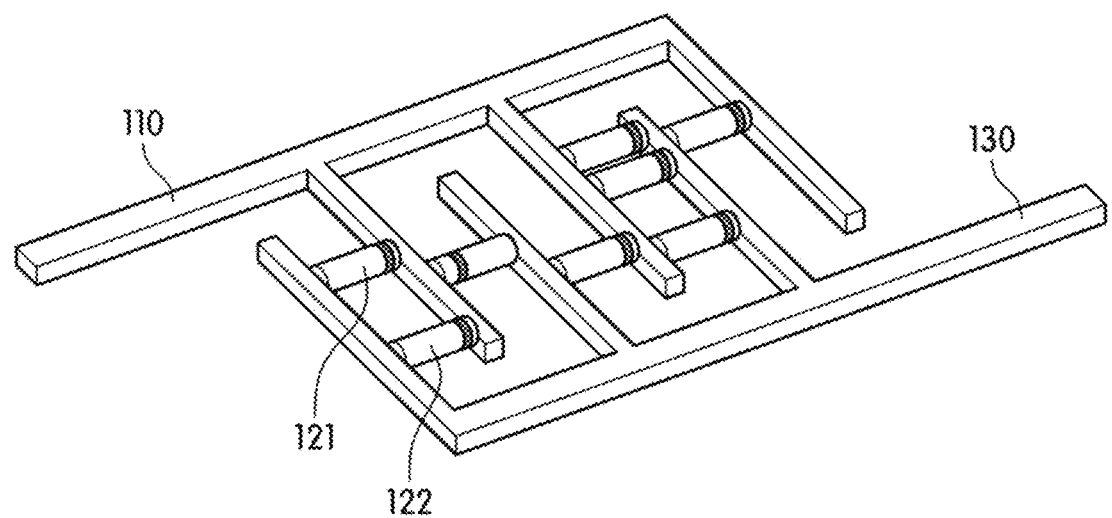

Hereinafter, embodiments of the present invention that are easily performed by those skilled in the art will be described in detail with reference to the accompanying drawings. The present invention may be implemented in several different forms and is not limited to the embodiments described herein. Parts irrelevant to description are omitted in the drawings in order to clearly explain the present invention. The same or similar components are denoted by the same reference numerals throughout this specification.

As illustrated in FIG. 1A, an ultra-small light-emitting diode (LED) electrode assembly according to the present invention includes an electrode line including a first mounting electrode 110 and a second mounting electrode 130 which are spaced apart from each other on the same plane and a plurality of ultra-small LED devices 121 and 122 each having one end in contact with the first mounting electrode and the other end in contact with the second mounting electrode.

In the ultra-small LED electrode assembly illustrated in FIG. 1A, the first mounting electrode 110 and the second mounting electrode 130 are located on the same plane, and thus the ultra-small LED devices 121 and 122 may be connected to the electrodes by being laid down. Therefore, there is an advantage in that the number of devices electrically connected to the electrodes is increased because it is not necessary for nano-scaled ultra-small LED devices to be three-dimensionally upright and to be bonded to the electrodes. In addition, photons generated inside the ultra-small LED devices are blocked by the electrodes and cannot be extracted and extinction of the photons therein is minimized, and thus light extraction efficiency of the ultra-small LED device can be significantly improved.

Meanwhile, in the ultra-small LED electrode assembly illustrated in FIG. 1A, all of a width of each of the electrodes, a distance between the electrodes, and a size of each of the ultra-small LED devices are on a micro-scale or nano-scale, and thus it is almost impossible for a person or a machine to mount and manufacture the individually separated ultra-small LED devices one by one. Accordingly, the inventor of the present invention has manufactured an ultra-small LED electrode assembly illustrated in FIG. 2A using a method in which a solution including ultra-small LED devices is dropped onto an ultra-small electrode line, assembly power is applied to the ultra-small electrode line, and the ultra-small LED devices are then self-aligned with and connected to two different mounting electrodes. The inventor has confirmed that when the ultra-small LED electrode assembly is actually driven with driving power, which is alternating current (AC) power, the ultra-small LED electrode assembly emits light (see FIG. 2B).

Figure 2A:
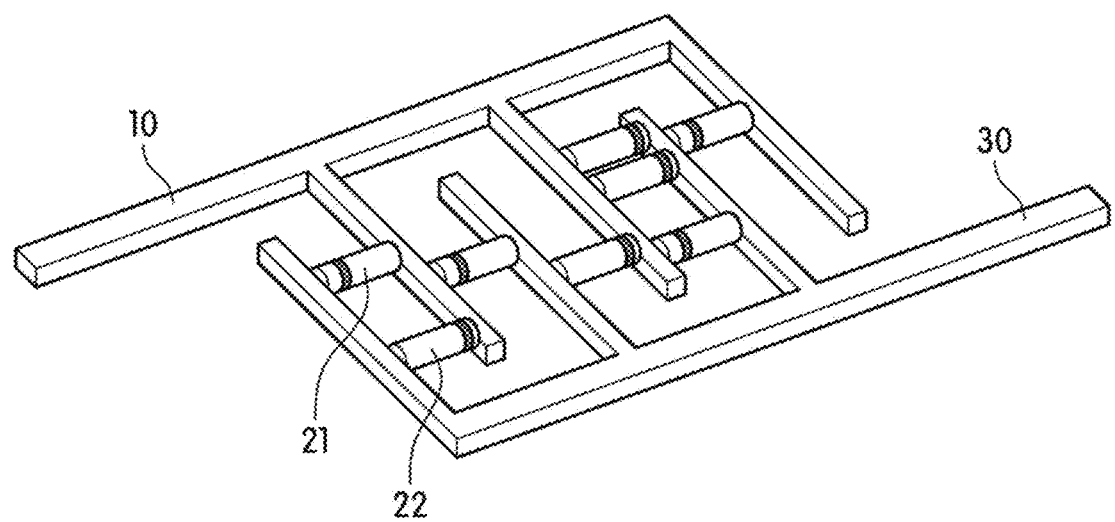
Figure 2B:
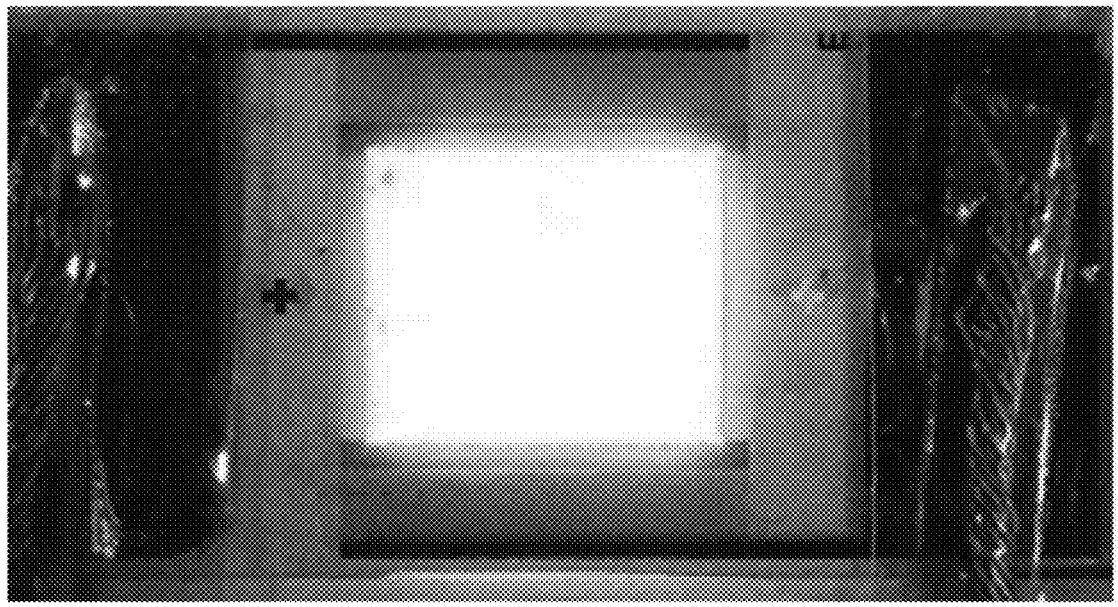

However, the ultra-small LED electrode assembly illustrated in FIG. 2A has a problem in that the number of devices that actually emit light when direct current (DC) power is used as driving power instead of AC power is significantly reduced. Specifically, when a degree of emission of visual light of an ultra-small LED electrode assembly that emits light by being driven according to a DC voltage, as illustrated in FIG. 2C, and a degree emission of visual light of an ultra-small LED electrode assembly that emits light by being driven according to an AC voltage, as illustrated in FIG. 2B, are compared to each other by varying only the type of driving power for the same ultra-small LED electrode assembly, it can be confirmed that light emitting efficiency is significantly reduced when DC power is used as the driving power.

Figure 2C:
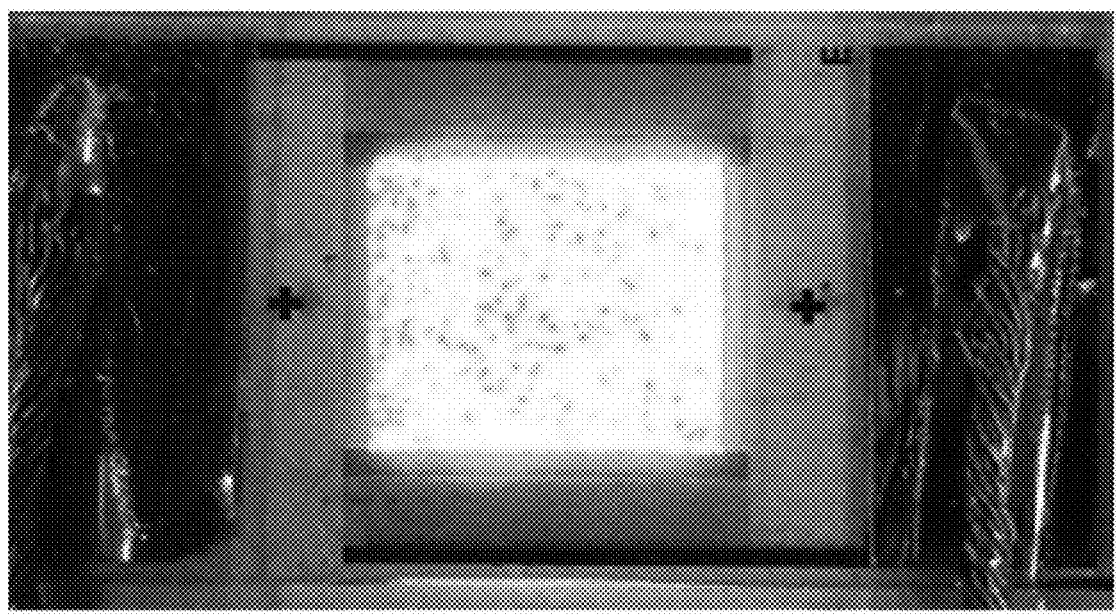

As illustrated in FIG. 2C, the problem of the luminance being reduced when the DC driving power is applied is because there is no alignment tendency between different mounting electrodes which come into direct or indirect contact with different conductive semiconductors (e.g., a P-type semiconductor and an N-type semiconductor) in each of the ultra-small LED devices in the electrode assembly. Specifically, as illustrated in FIG. 2A, in four of eight ultra-small LED devices mounted on the ultra-small LED electrode assembly, the same type of semiconductor comes into contact with the first mounting electrode 10, like in a first ultra-small LED device 21. In the other four ultra-small LED devices, the other type of semiconductor device comes into contact with the first mounting electrode 10. Therefore, when one-way DC driving power is applied to the ultra-small LED electrode assembly illustrated in FIG. 2A, only four of the ultra-small LED devices can emit light and the remaining four ultra-small LED devices cannot emit light. This problem is directly related to luminance reduction.

As a result, when the ultra-small LED devices are self-aligned by a conventional manufacturing method, both ends of each of the ultra-small LED device may come into contact with two different electrodes, respectively. However, in the manufactured ultra-small LED electrode assembly, each of the ultra-small LED devices in contact with the first mounting electrode has a specific one end, for example, a P-type semiconductor, which comes into contact with only the first mounting electrode, and some of the ultra-small LED devices have an N-type semiconductor, which comes into contact with the first mounting electrode. Since a semiconductor layer which also comes into contact with a specific mounting electrode is different every time the ultra-small LED electrode assembly is manufactured, an ultra-small LED electrode assembly which can emit light by using a DC voltage as driving power can be manufactured in some cases, but such an electrode assembly cannot always be manufactured.

As a result of continuing research to address the problem of a selection limitation of the driving power of the conventional ultra-small LED device described above by the inventor of the present invention, when the ultra-small LED device is self-aligned by applying assembly power to the ultra-small LED electrode assembly under a specific condition of the present invention, a specific semiconductor layer in the ultra-small LED device may come into contact with a specific mounting electrode, and specifically, a first conductive semiconductor layer or a second conductive semiconductor layer may be self-aligned with a first mounting electrode or a second mounting electrode. Therefore, it can be confirmed that the ultra-small LED electrode assembly may be driven through DC driving power, and, at the same time, a more improved luminance characteristic may be exhibited, which leads to the present invention.

Hereinafter, first, a method of manufacturing an ultra-small LED electrode assembly according to the present invention that may be driven by a DC voltage, as described above, will be described.

The method of manufacturing the ultra-small LED electrode assembly according to the present invention includes (1) a step of introducing a solution including a plurality of ultra-small LED devices to an electrode line including a first mounting electrode and a second mounting electrode, which is formed on the same plane as the first mounting electrode to be spaced apart from the first mounting electrode, and (2) a step of applying power, which has an asymmetric assembly voltage of 10 V or more according to the following Equation 1, to the electrode line and self-mounting the plurality of ultra-small LED devices such that ends of each of the ultra-small LED devices come into contact with the first mounting electrode and the second mounting electrode.

First, in step (1), the introducing of the solution including the plurality of ultra-small LED devices into the electrode line including the first mounting electrode and the second mounting electrode, which is formed on the same plane as the first mounting electrode to be spaced apart from the first mounting electrode, is performed.

Figure 3:
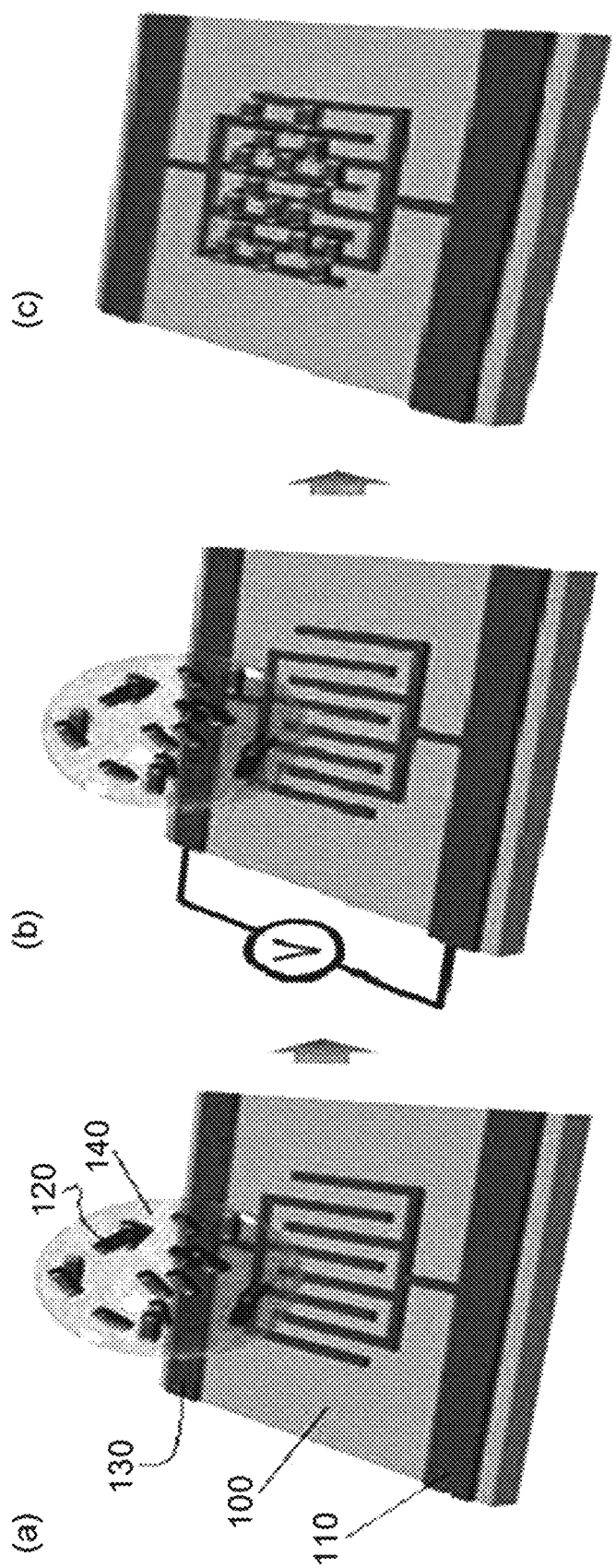
FIG. 3 shows schematic views illustrating a process of manufacturing an ultra-small LED electrode assembly according to one embodiment of the present invention.

Specifically, FIG. 3 shows schematic views illustrating a process of manufacturing an ultra-small LED electrode assembly according to one embodiment of the present invention. In FIG. 3 (a), the first mounting electrode 110 formed on a base substrate 100, the second mounting electrode 130 which is formed on the same plane as the first mounting electrode to be spaced apart from the first mounting electrode, and a solution (ultra-small LED devices 120 and a solvent 140) including a plurality of ultra-small LED devices are illustrated. Although not illustrated in FIG. 3, an insulating partition may be further provided in a mountable region of the electrode line to which the solution including the ultra-small LED devices is introduced to prevent the solution from spreading beyond a region of the electrode line in which the ultra-small LED devices will be mounted after the solution including the ultra-small LED devices is introduced thereto.

Since a specific method of manufacturing the base substrate, the electrode line including the first mounting electrode and the second mounting electrode, and the insulating partition that can be formed on the electrode line, a structure, a solvent in the introduced solution, the content of the ultra-small LED devices in the solution, and the like may be described with reference to Korean Patent Registration No. 10-1429095 and Korean Patent Application No. 10-2014-0085384 by the inventors of the present invention, detailed descriptions thereof will be omitted in the present invention.

According to one embodiment of the present invention, an insulating film may be further provided on outer surfaces of the first mounting electrode and the second mounting electrode. Due to a distance between the first mounting electrode and the second mounting electrode reduced due to the insulating film, the ultra-small LED device may be self-mounted so that all of both ends thereof are located on the first mounting electrode and the second mounting electrode. In this case, the number of ultra-small LED devices that can be mounted may be increased due to improvement of mounting alignment of the ultra-small LED devices, and a more highly-efficient ultra-small LED electrode assembly may be easily implemented. Further, in step (2) described below, the ultra-small LED devices may be introduced into the first mounting electrode and the second mounting electrode in a mixed state with the solvent. When power is applied to the ultra-small LED devices in order to self-mount thereof, electrical short-circuit may occur between two different mounting electrodes due to the solvent, and thus the electrodes may be damaged. However, there is an advantage in that electrical short-circuit between the electrodes due to the solvent may be prevented by the insulating film provided on the outer surfaces of the first mounting electrode and the second mounting electrode.

Next, in step (2) according to the present invention, the applying of the power, which has an asymmetric assembly voltage of 10 V or more according to the following Equation 1, to the electrode line and the self-mounting of the plurality of ultra-small LED devices such that the ends of each of the ultra-small LED devices come into contact with the first mounting electrode and the second mounting electrode are performed.

In step (2), an electric field is formed on the mounting electrode, polarization occurs in the ultra-small LED device under the electric field, and the device may be moved to, self-aligned with, and mounted on the electrode by itself through various physical forces such as an electrostatic attraction between the polarized ultra-small LED device and an mounting electrode adjacent thereto and the like. However, in order to improve an orientation of the mounted ultra-small LED devices so that each of the devices is moved to and self-aligned with the electrode by itself and the first conductive semiconductor layer in the device comes into contact with the first mounting electrode, it is necessary to apply the power, which has an asymmetric assembly voltage of 10 V or more according to the following Equation 1, to the electrode line.

$$\text{Asymmetric assembly voltage } (V) = |A(V)| - |B(V)| \quad \text{[Equation 1]}$$

wherein A and B denote magnitudes of an upper peak voltage and a lower peak voltage of the applied power, respectively.

In the conventional ultra-small LED electrode assembly by the present inventor, a symmetrical assembly voltage with a value according to the above Equation 1 of 0 V is used as the power applied in step (2). Such a symmetrical assembly voltage randomly determines an orientation of a specific mounting electrode of the ultra-small LED device, and thus the ultra-small LED device may not be mounted to have a specific orientation.

Figure 4A:
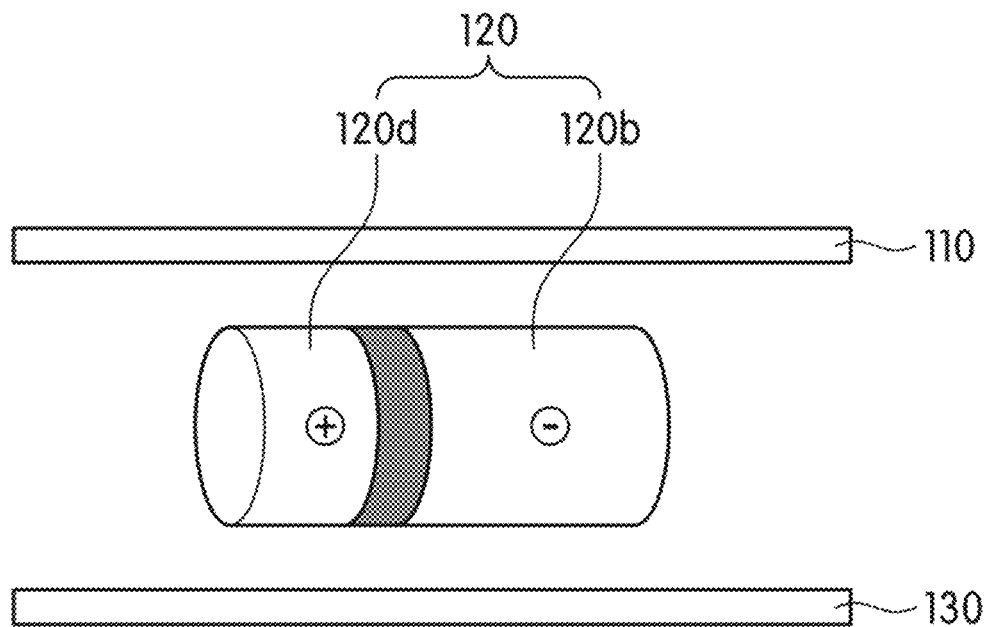
Figure 4B:
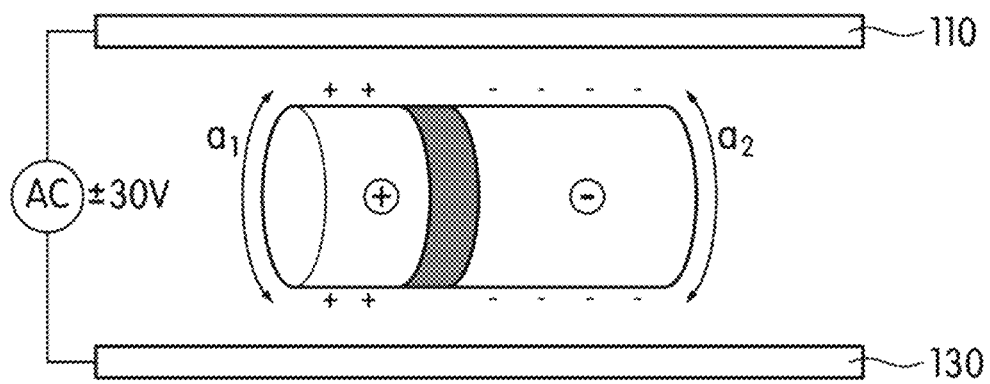

Specifically, FIG. 4A corresponds to a state immediately after step (1) and illustrates an ultra-small LED device 120 including a first conductive semiconductor layer 120b and a second conductive semiconductor layer 120d which are introduced into a different first mounting electrode 110 and second mounting electrode 130. Although not illustrated in FIG. 4A, the ultra-small LED devices 120 is mixed with a solvent. Conventionally, as illustrated in FIG. 4B, voltages are applied so that magnitudes of peaks of the voltages applied to the first mounting electrode 110 and the second mounting electrode 130 are symmetrical ($V_{AC}=\pm 30$ V). IN THIS CASE, AS illustrated in FIG. 2B, when lengths of the first conductive semiconductor layer 120b and the second conductive semiconductor layer 120d in the ultra-small LED device are the same and all other influences of the surroundings are excluded, magnitudes a1 and a2 of electrostatic attractions applied to the ultra-small LED device between two electrodes may be the same. In this case, a probability that the first conductive semiconductor layer 120b comes into contact with the first mounting electrode 110 may be 50%. Expanding on this, in each of the plurality of ultra-small LED devices introduced to the mounting electrodes, the first conductive semiconductor layer 120b may come into contact with the first mounting electrode 110 at a probability of about 50% and a probability that a total of ten ultra-small LED devices are mounted to and come into contact with the first mounting electrode 110 is only $(½)^{10}$.

Figure 4C:
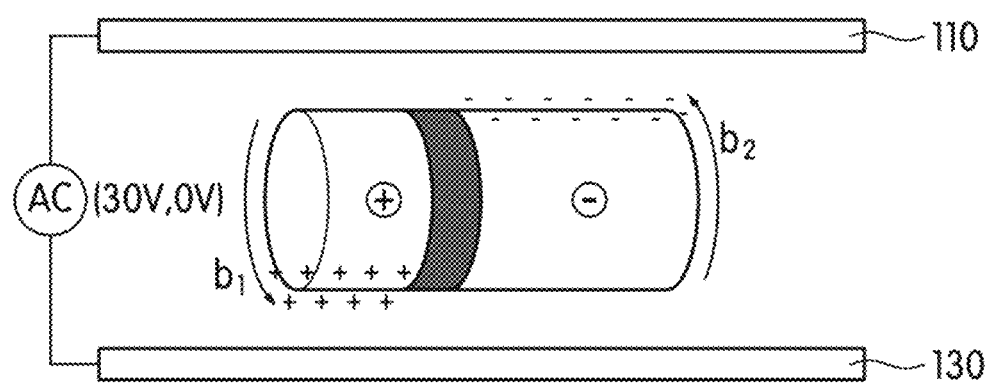

However, as illustrated in FIG. 4C, when voltages are asymmetrically applied to the first mounting electrode 110 and the second mounting electrode 130, since a polarization state on a surface of the ultra-small LED device is formed different from that of FIG. 4B, electrostatic attractions b1 and b2 for moving the first conductive semiconductor layer 120b toward the first mounting electrode 110 and moving the second conductive semiconductor layer 120d toward the second mounting electrode 130 become stronger, and a probability that the first conductive semiconductor layer 120b comes into contact with the first mounting electrode 110 is significantly increased. Expanding on this, the plurality of the ultra-small LED devices introduced to the mounting electrode may have an orientation and may more easily come into contact with the first mounting electrode.

However, immediately after step (1) is performed, all of the ultra-small LED devices may not be arranged in parallel between the two electrodes, as illustrated in FIG. 4A. Some of the ultra-small LED devices may be obliquely arranged at varying degrees and the other ultra-small LED devices may be placed on any one of the mounting electrodes. The ultra-small LED devices may be asymmetrically formed so that lengths of the conductive semiconductor layers in the ultra-small LED devices are different. Therefore, in order to further improve an orientation of a specific semiconductor layer of the ultra-small LED device to come into contact with a specific mounting electrode in consideration of all of these situations, an asymmetric assembly voltage of the assembly power applied to the mounting electrodes must be 10 V or more, preferably, 14 V, more preferably, 18 V, and most preferably, 25 V or more, according to the above Equation 1. When the asymmetric assembly voltage according to Equation 1 is less than 10 V, the orientation is reduced such that the specific semiconductor layer of the ultra-small LED device comes into contact with the specific mounting electrode. Therefore, there is a problem in that the luminance when a DC is applied to the manufactured ultra-small LED electrode assembly as driving power is significantly lowered in comparison to when an AC is applied thereto as the driving power. On the other hand, when the asymmetric assembly voltage according to Equation 1 is more than 50 V, there is no problem of the orientation of the ultra-small LED device being in a specific direction, but the electrode may be damaged.

Meanwhile, A and B in the above Equation 1 do not refer to voltages respectively applied to the first mounting electrode and the second mounting electrode. That is, when 30 V, 0 V, 30 V, 0 V, . . . are applied to the first mounting electrode at a predetermined cycle and 0 V, 30 V, 0 V, 30 V, . . . are applied to the second mounting electrode at the same cycle, such a power application method is the same as when +30 V and −30 V are applied to the mounting electrode line with a pulse wave at a predetermined cycle. In this case, the value according to the above Equation 1 is zero, which means that a symmetrical voltage is applied to the electrodes.

According to one embodiment of the present invention, the power may be power having a predetermined cycle, preferably, power having a frequency of 50 kHz to 1 GHz, and more preferably, power having a sine wave waveform having a frequency of 90 kHZ to 100 MHz.

When the power is power having no cycle, for example, when a predetermined voltage is continuously applied to the mounting electrodes without change, the mounting electrodes may be damaged even when the above-described Equation 1 is satisfied. When there is much damage, the mounted ultra-small LED device may not be driven by the mounting electrode.

In the case in which the frequency is less than 50 kHz, even when a voltage range is satisfied, the number of the mounted ultra-small LED devices is significantly reduced, the device orientation also becomes very irregular, and thus a DC may not be used as the driving power. In the case in which the frequency is more than 1 GHz, since the ultra-small LED device may not adapt to rapidly changing power, a mounting property of the device is lowered, the orientation thereof is also reduced, and as a result, a DC may not be used as the driving power like in the case of the low frequency.

Meanwhile, preferably, the above-described power may have an effective voltage $V_{rms}$ of 12 V or more, and more preferably, of 17 V or more. This is because the number of ultra-small LED devices mounted when an effective voltage of power is low may be reduced. That is, when the power satisfies the value according to the above-described Equation 1 and is applied to the mounting electrodes to implement the ultra-small LED electrode assembly, DC driving may be possible because a mounting tendency in which a specific semiconductor layer of the ultra-small LED device is electrically connected to a specific mounting electrode is high. However, the number of the mounted ultra-small LED devices is reduced, and thus there is a concern that an amount of light emitted when the driving power is applied is significantly lowered.

After performing step (2), (3) a step of performing heat treatment at a temperature of 300 to 1000° C. for 0.5 to 10 minutes may be further performed on the electrode line and the ultra-small LED devices self-aligned on the electrode line. In this case, the heat treatment temperature may be more preferably 600° C. or more. The heat treatment step is a process for causing the ultra-small LED devices to come into contact with different mounting electrodes and then removing the solvent that was introduced to facilitate movement and alignment of the ultra-small LED devices. When the driving power is applied in a state in which the solvent is not completely removed or a metal ohmic layer is formed to reduce a contact resistance between the mounting electrode and the ultra-small LED device, the ultra-small LED electrode assembly may fail to exhibit a desired level of light emitting efficiency. Also, unremoved solvent may cause process defects in a step of forming the metal ohmic layer, a degree of formation thereof may be slight even when the metal ohmic layer is formed, and a large current loss may occur. When the heat treatment is performed at less than 200° C. and/or for less than 0.5 minute, impurities may not be completely removed and a contact reaction between the ultra-small LED device and the electrode may not completely occur. When the heat treatment is performed at more than 1,000° C. and/or for more than 10 minutes, the base substrate and/or the electrode may be deformed or broken and the voltage may not be properly applied to the ultra-small LED device due to a resistance increase. In addition, step (3) is preferably performed again after the metal ohmic layer, which will be described later, is formed. Accordingly, an ultra-small LED electrode assembly that exhibits a further improved light emitting efficiency may be implemented.

Meanwhile, in the method of manufacturing the ultra-small LED electrode assembly according to one embodiment of the present invention, after step (2), a step of forming a metal ohmic layer at contact portions between the ultra-small LED device and the first mounting electrode and the second mounting electrode may be further performed. The step of forming the metal ohmic layer is preferably performed after the above-described step (3).

The reason for forming the metal ohmic layer at the contact portions is for reducing contact resistance that may occur between the electrode and the ultra-small LED device when the driving power is applied and further improving the light emitting efficiency. Any metal ohmic layer may be used without limitation as long as it is formed by a conventional method known in the art and the present invention is not limited to a specific method thereof, and thus a description thereof will be omitted. Also, a known material may be used as a material of the metal ohmic layer.

The ultra-small LED electrode assembly implemented through the above-described manufacturing method according to one embodiment of the present invention includes the electrode line including the first mounting electrode 110 and the second mounting electrode 130 which are spaced apart from each other on the same plane and the plurality of ultra-small LED devices 121 and 122 each having one end in contact with the first mounting electrode and the other end in contact with the second mounting electrode, as illustrated in FIG. 1A, and a luminance gain according to the following Equation 2 satisfies 10% or more.

Figure 5:
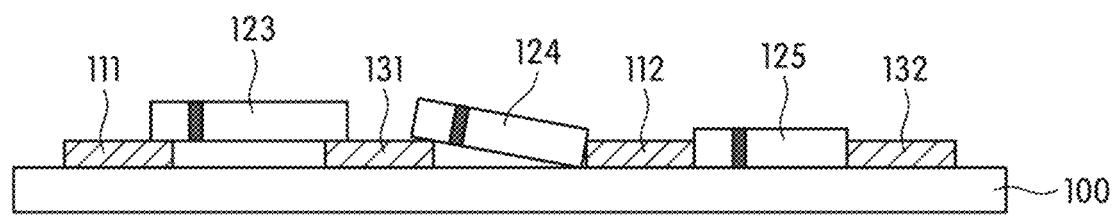
FIG. 5 is a schematic view illustrating various types of contact between mounting electrodes and both ends of an ultra-small LED device in an ultra-small LED electrode assembly according to one embodiment of the present invention.

First, a contact type between the ultra-small LED device and each of the first mounting electrode and the second mounting electrode will be described. As illustrated in FIG. 5, first mounting electrodes 111 and 112 and second mounting electrodes 131 and 132 are formed on the base substrate 100 to be spaced apart from each other on the same plane, and three ultra-small LED devices 123, 124, and 125 are two-dimensionally mounted thereon by being laid down. The first ultra-small LED device 123 among the three ultra-small LED devices 123, 124, and 125 is mounted so that both ends thereof come into contact with upper portions of the first mounting electrode 111 and the second mounting electrode 131, respectively. The second ultra-small LED device 124 has one end in contact with an upper portion of the second mounting electrode 131 and the other end in contact with a side surface of the first mounting electrode 112. The third ultra-small LED device 125 has both ends in contact with side surfaces of the first mounting electrode 112 and the second mounting electrode 132, respectively. As illustrated in FIG. 5, in the electrode assembly according to one embodiment of the present invention, there may be various contact types in a single ultra-small LED electrode assembly, such as the case in which the ultra-small LED device may be inserted into a space between two mounting electrodes and come into contact therewith, the case in which the ultra-small LED device may be overlaid on two mounting electrodes and come into contact therewith, and the like. Meanwhile, the present invention is not limited to the contact types illustrated in FIG. 5, for example, the ultra-small LED device may be inserted into a space between two mounting electrodes and come into contact therewith by a multilayer being formed in the space.

In the ultra-small LED devices mounted on the ultra-small LED electrode assembly according to the present invention, about 60% or more of the total number of the mounted ultra-small LED devices are implemented such that the same type of semiconductor, for example, a first conductive semiconductor layer, comes into contact with the same type of electrode, for example, the first mounting electrode, and thus the ultra-small LED devices have an improved orientation. Even when an AC is not used as driving power but a DC is used as the driving power, 60% or more of the ultra-small LED devices may emit light and a luminance characteristic thereof may be sufficiently exhibited. Since the DC is used as the driving power, a circuit configuration is further simplified, and the use of the DC is advantageous in terms of production efficiency and production cost. When less than 60% of the all of the mounted ultra-small LED devices exhibit a unidirectional orientation, a luminance exhibited when the DC is used as the driving power is significantly lower in comparison to a luminance exhibited when an AC is used as the driving power, and thus the ultra-small LED electrode assembly may not be driven by the DC driving power.

Preferably, the number of the ultra-small LED devices in which the first conductive semiconductor layer comes into direct or indirect contact with the first mounting electrode may be 80% or more of the total number of the mounted ultra-small LED devices. Accordingly, a more improved luminance characteristic may be exhibited.

In addition, the ultra-small LED electrode assembly according to one embodiment of the present invention may have 1,000 or more ultra-small LED devices mounted per unit area (mm$^2$). Accordingly, an excellent luminance characteristic may be exhibited. Meanwhile, an average number of the ultra-small LED devices mounted per unit area does not refer to the number of the mounted ultra-small LED devices in a total area including electrode regions in which the ultra-small LED devices may not be substantially mounted, but refers to the number of the mounted ultra-small LED devices obtained by converting the number of the mounted ultra-small LED devices on the basis of an area of the electrode line on which the ultra-small LED devices may be substantially mounted.

Meanwhile, any ultra-small LED device may be used as the ultra-small LED device provided in the ultra-small LED electrode assembly without limitation as long as it can be generally widely used for a lamp, a display, and the like. Preferably, a length of the ultra-small LED device may range from 100 nm to 10 μm, and more preferably, from 500 nm to 5 μm. When the length of the ultra-small LED device is less than 100 nm, it is difficult to manufacture a highly efficient LED device. When the length is more than 10 μm, a light emission efficiency of the LED device may be lowered. The ultra-small LED device may have various shapes such as a cylindrical shape, a rectangular parallelepiped shape, and the like, and preferably, may have a cylindrical shape, but the present invention is not limited thereto. In addition, an aspect ratio of the ultra-small LED device may range from 1.2 to 100, may preferably range from 1.2 to 50, may more preferably range from 1.5 to 20, and may most preferably range from 1.5 to 10. When the aspect ratio of the ultra-small LED device is less than 1.2, the ultra-small LED device may not be self-aligned even when power is applied to the electrode line. When the aspect ratio is more than 100, a voltage of power necessary for self-alignment may be lowered. However, it may be difficult to manufacture a device having an aspect ratio of more than 100 due to process limitations when manufacturing the ultra-small LED device by dry etching or the like.

Also, the ultra-small LED device may include the first conductive semiconductor layer and the second conductive semiconductor layer, and more preferably, may include the first conductive semiconductor layer, an active layer formed on the first conductive semiconductor layer, the second conductive semiconductor layer formed on the active layer, and an insulating film configured to cover at least an entire outer surface of an active layer portion of outer surfaces of the device.

In this case, any one of the first conductive semiconductor layer and the second conductive semiconductor layer may include at least one N-type semiconductor layer, and the other conductive semiconductor layer may include at least one P-type semiconductor layer. When the ultra-small LED device is a blue light emitting device, the N-type semiconductor layer may be made with a material selected from semiconductor materials having a composition formula of $In_xAl_yGa_{1-x-y}N$ ($0 \le x \le 1$, $0 \le y \le 1$, and $0 \le x+y \le 1$), for example, any material selected from InAlGaN, GaN, AlGaN, InGaN, AlN, InN, and the like, and may be doped with a first conductive dopant (e.g., Si, Ge, Sn, etc.). Preferably, a thickness of the N-type semiconductor layer may range from 500 nm to 5 μm, but the present invention is not limited thereto. Since a light emission color of the ultra-small LED is not limited to the blue color, there is no limitation in using another type of III-V group semiconductor material as the N-type semiconductor layer when the light emission color is different. In addition, the P-type semiconductor layer may be made with a material selected from semiconductor materials having a composition formula of $In_xAl_yGa_{1-x-y}N$ ($0 \le x \le 1$, $0 \le y \le 1$, and $0 \le x+y \le 1$), for example, any material selected from InAlGaN, GaN, AlGaN, InGaN, AlN, InN, and the like, and may be doped with a second conductive dopant (e.g., Mg). Preferably, a thickness of the P-type semiconductor layer may range from 500 nm to 5 μm, but the present invention is not limited thereto. Since the light emission color of the ultra-small LED is not limited to the blue color, there is no limitation in using another type of III-V group semiconductor material as the P-type semiconductor layer when the light emission color is different.

The active layer may be interposed between the first conductive semiconductor layer and the second conductive semiconductor layer. When an electric field is applied to the device, light is generated in the active layer by coupling of electron-hole pairs. The active layer may be formed to have a single or multiple quantum well structure. A cladding layer doped with a conductive dopant may be formed above and/or below the active layer, and the cladding layer doped with the conductive dopant may be implemented as an AlGaN layer or an InAlGaN layer. In addition, materials such as AlGaN, AlInGaN, and the like may be used as the active layer. Preferably, a thickness of the active layer may range from 10 to 200 nm, but the present invention is not limited thereto. The active layer may be formed at various positions according to the type of the LED. Since the light emission color of the ultra-small LED device is not limited to the blue color, there is no limitation in using another type of III-V group semiconductor material as the active layer when the light emission color is different.

An electrode layer may be further formed above the first conductive semiconductor layer and/or below the second conductive semiconductor layer. When the conductive semiconductor layer further includes the electrode layer, the contact between the mounting electrode and the ultra-small LED device may occur between the electrode layer and the mounting electrode and/or between the mounting electrode and both of the electrode layer and the conductive semiconductor layer. A metal or metal oxide used as an electrode of a conventional LED device may be used as the electrode layer, and preferably, chromium (Cr), titanium (Ti), aluminum (Al), gold (Au), nickel (Ni), ITO, oxides thereof, or alloys thereof may be used as the electrode, but the present invention is not limited thereto. Preferably, a thickness of the electrode layer may range from 1 to 100 nm, but the present invention is not limited thereto. When the electrode layer is included therein, there is an advantage in that the electrode layer and the mounting electrode may come into contact with each other at a temperature lower than a temperature required in a process of forming the metal ohmic layer at a contact portion between the conductive semiconductor layer and the mounting electrode.

The insulating film may include at least an active layer, and an outer surface of the ultra-small LED device may be coated with the insulating film, and, more preferably, at least one of the first conductive semiconductor layer and the second conductive semiconductor layer may be coated with the insulating film to prevent durability degradation of the ultra-small LED device due to damage of an outer surface of the semiconductor layer. The insulating film serves to prevent an electrical short-circuit that occurs in the ultra-small LED device when the active layer included in the ultra-small LED device comes into contact with the mounting electrode. In addition, since the insulating film may protect the outer surface of the ultra-small LED device including the active layer, surface defects of the active layer may be prevented, and thus light emission efficiency degradation may be prevented. The insulating film may preferably include at least one material of silicon nitride ($Si_3N_4$), aluminum oxide ($Al_2O_3$), hafnium oxide ($HfO_2$), yttrium oxide ($Y_2O_3$), and titanium dioxide ($TiO_2$), and more preferably, may include a transparent material which is made of the above components, but the present invention is not limited thereto. A transparent insulating film may serve as the above insulating film, and, at the same time, and the ultra-small LED device may be coated with the insulating film to minimize the reduction of the light emission efficiency which may occur.

Meanwhile, the ultra-small LED electrode assembly according to the present invention may include the electrode line including the first mounting electrode and the second mounting electrode which are spaced apart from each other on the same plane and the plurality of ultra-small LED devices each having one end in contact with the first mounting electrode and the other end in contact with the second mounting electrode. A luminance gain according to the following Equation 2 may satisfy 1.1 or more, and preferably, may satisfy 1.3 or more.

$$\text{Luminance gain} = \frac{\text{Luminance of ultra-small LED electrode assembly driven by DC voltage (cd/m}^2\text{)}}{\text{Luminance of ultra-small LED electrode assembly driven by AC voltage (cd/m}^2\text{)}} \quad \text{[Equation 2]}$$

The above Equation 2 illustrates a ratio of a luminance when DC power is applied to an ultra-small LED electrode assembly as driving power to a luminance when AC power is applied to the ultra-small LED electrode assembly as the driving power with respect to the same ultra-small LED electrode assembly, and, in this case, a magnitude of a voltage V of the DC power is equal to an effective voltage $V_{rms}$ of AC power having a sine waveform. That is, a luminance gain of more than 1 means that even when the ultra-small LED electrode assembly is driven using the DC power as the driving power, an improved luminance may be exhibited in comparison to when the AC power is used as the driving power. The DC power may be more efficient than the AC power as the driving power, and the ultra-small LED electrode assembly may be more suitable for various electronic parts and apparatuses using DC power as driving power. A simple DC driving circuit may be used and may be more advantageous in terms of productivity and production cost.

Specifically, an electric field emission spectrum of an ultra-small LED electrode assembly (FIG. 2A to 2C) manufactured through a conventional manufacturing method, and it can be confirmed that an area of a graph measured for each wavelength when a DC voltage of 21.2 V is applied thereto as driving power is only 0.51 times an area of a graph measured for each wavelength when AC power having a sine waveform with a peak voltage of ±21.2 V and a frequency of 60 Hz is applied thereto as the driving power, a maximum intensity of light emitted by the ultra-small LED electrode assembly when DC power is applied thereto as the driving power is only about 0.52 times a maximum intensity of light when AC power is applied thereto as the driving power, and thus a luminance and an intensity of light in a specific wavelength band are significantly lowered.

In comparison to the ultra-small LED electrode assembly manufactured through the conventional manufacturing method, in the ultra-small LED electrode assembly (FIG. 2A to 2B) manufactured through one embodiment of the present invention, it can be confirmed that an area of a graph measured for each wavelength when a DC voltage of 21.2 V is applied thereto as driving power is significantly increased to be 1.12 times an area of a graph measured for each wavelength when AC power having a sine waveform with a peak voltage of ±21.2 V and a frequency of 60 Hz is applied thereto as the driving power. In addition, it can be confirmed that a maximum intensity of light emitted by the ultra-small LED electrode assembly when DC power is applied thereto as the driving power is significantly increased to be about 1.19 times a maximum intensity of light when AC power is applied thereto as the driving power.

In addition, in an ultra-small LED electrode assembly (FIG. 1A to 1C) manufactured through another embodiment of the present invention, it can be confirmed that an area of a graph measured for each wavelength when a DC voltage of 21.2 V is applied thereto as driving power is significantly increased to be 1.43 times an area of a graph measured for each wavelength when AC power having a sine waveform with a peak voltage of ±21.2 V and a frequency of 60 Hz is applied thereto as the driving power. In addition, it can be confirmed that a maximum intensity of light emitted by the ultra-small LED electrode assembly when DC power is applied thereto as the driving power is significantly increased to be about 1.47 times a maximum intensity of light when AC power is applied thereto as the driving power.

Meanwhile, the present invention includes a lamp including the above-described ultra-small LED electrode assembly according to the present invention. The lamp may further include a support for accommodating or supporting the ultra-small LED electrode assembly. Any support usually used for an LED lamp may be used as the support without limitation, and the lamp may preferably have any one material selected from the group consisting of an organic resin, ceramics, a metal, and an inorganic resin, and the material may be transparent or opaque. The support may have a cup shape or a flat plate shape, but the present invention is not limited thereto. The support may be designed to have a different shape according to the purpose, and the shape of the support is not limited in the present invention. When a support has a cup shape, an internal volume of the support may vary in in proportion to a size and density of the electrode on which the ultra-small LED devices are arranged. Also, the internal volume of the support may vary according to a thickness of the support. The thickness of the support may be the same at all points of the support or may be different at some point thereof. Since the support may be designed to have a different thickness according to the purpose, the thickness of the support is not limited in the present invention.

The lamp may further include a phosphor provided inside the support and excited by light emitted from the ultra-small LED device. For example, when the ultra-small LED device is an ultraviolet (UV) light ultra-small LED device, a phosphor excited by UV light may preferably be a phosphor having any one of blue, yellow, green, amber, and red colors. In this case, the lamp may be a single color LED lamp which emits a selected color. Preferably, the phosphor excited by UV light may be a phosphor having at least one of blue, yellow, green, amber, and red colors, and more preferably, may be a mixed phosphor having any one of blue/yellow, blue/green/red, and blue/green/amber/red colors. In this case, the phosphor may irradiate white light. Specifically, since the phosphor may be selected and used from known phosphors in consideration of a color of light emitted by the selected ultra-small LED device, a detailed description thereof will be omitted in the present invention.

In addition, the present invention may include a backlight unit (BLU) including the ultra-small LED electrode assembly according to the present invention.

Figure 6:
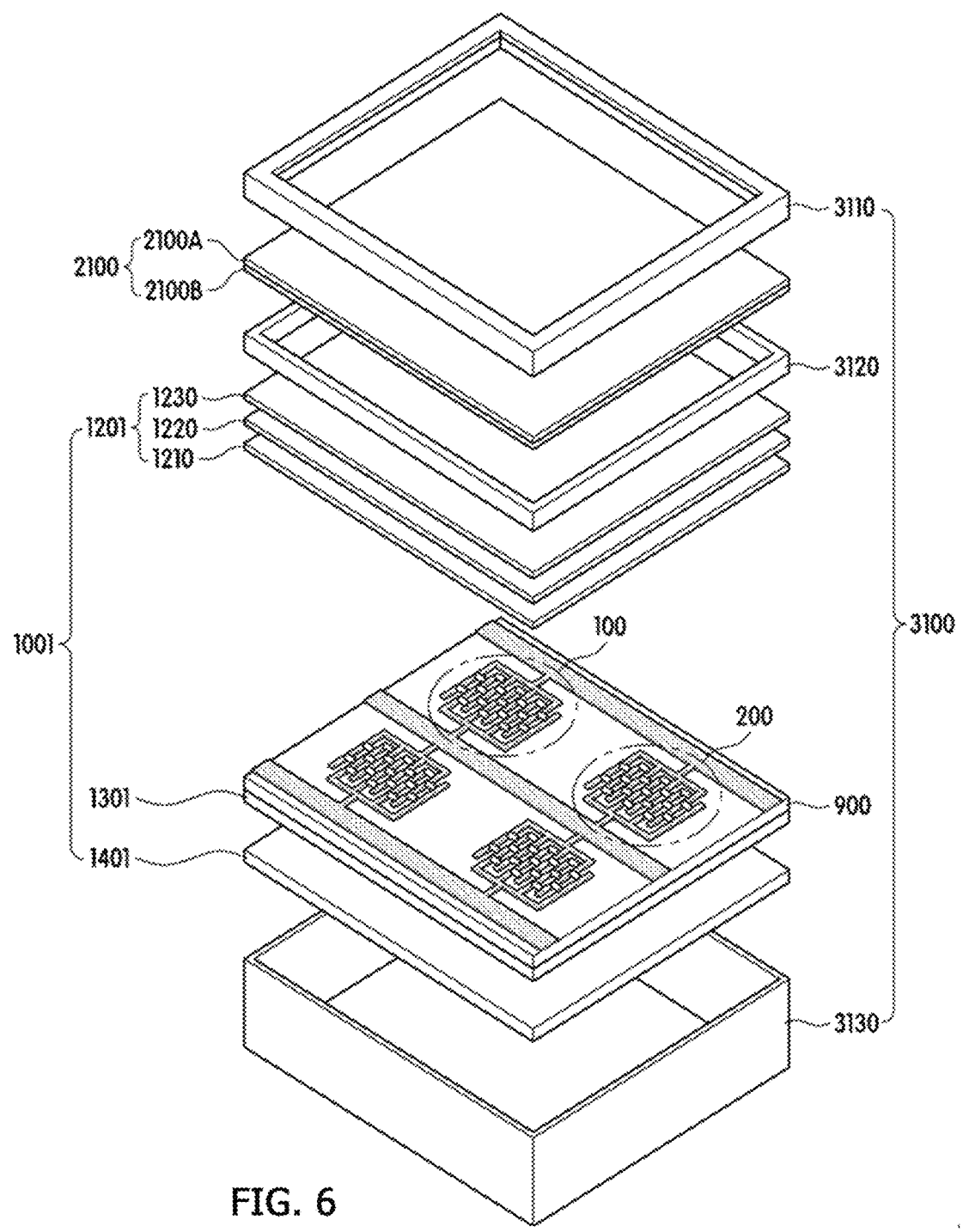
FIG. 6 is an exploded perspective view illustrating a light-receiving display including a backlight unit (BLU) having a light source which includes an ultra-small LED electrode assembly according to one embodiment of the present invention.

Specifically, in FIG. 6, a light-receiving display may include a BLU 1001, a display panel 2100 positioned on the BLU 1001, and a support member 3100 configured to accommodate and support the BLU 1001 and the display panel 2100. In this case, the BLU 1001 may further include a light emitting unit 100,200,900 configured to supply light to the display panel, and a reflective member 1301 which is disposed below the light emitting unit 100,200,900 and reflects light incident from the light emitting unit toward the display panel on which an image is displayed. The BLU 1001 may further include an optical sheet 1201 between the light emitting unit 100,200,900 and the display panel 2100 to guide, diffuse, and/or condense the light emitted from the light emitting unit 100,200,900 into linear polarized light in a specific direction. The BLU 1001 may further include a heat dissipating member 1401 below the reflective member 1301. The ultra-small LED electrode assembly according to one embodiment of the present invention may be provided as a light source in the light emitting unit 100,200,900. Since a known configuration in the display field may be applied to each configuration of the BLU and each configuration of the display, detailed descriptions thereof will be omitted in the present invention.

Although the present invention will be described in more detail with reference to the following examples, the following examples do not limit the scope of the present invention, and should be construed as facilitating understanding of the present invention.

Example 1

An electrode line, as illustrated in FIG. 1A, was prepared on an 800 μm thick quartz base substrate. In this case, in the electrode line, a width of a first mounting electrode was 3 μm, a width of a second mounting electrode was 3 μm, a distance between the first mounting electrode and the second mounting electrode adjacent thereto was 2.2 μm, a thickness of each of the electrodes was 0.2 μm, a material of each of the first mounting electrode and the second mounting electrode was gold, and an area of a region of the electrode line on which ultra-small LED devices were to be mounted was $4.2 \times 10^7$ μm². An insulating partition made of silicon dioxide and having a height of 0.1 μm from the base substrate to a top thereof was then formed on the base substrate. In this case, the insulating partition was formed on the base substrate to surround the region (the area of $4.2 \times 10^7$ μm²) of the electrode line on which the ultra-small LED devices were to be mounted.

Then, a solution including the ultra-small LED devices was prepared by mixing 0.7 parts by weight of ultra-small LED device having a structure illustrated in the following Table 1 with respect to 100 parts by weight of acetone.

Figure 8:
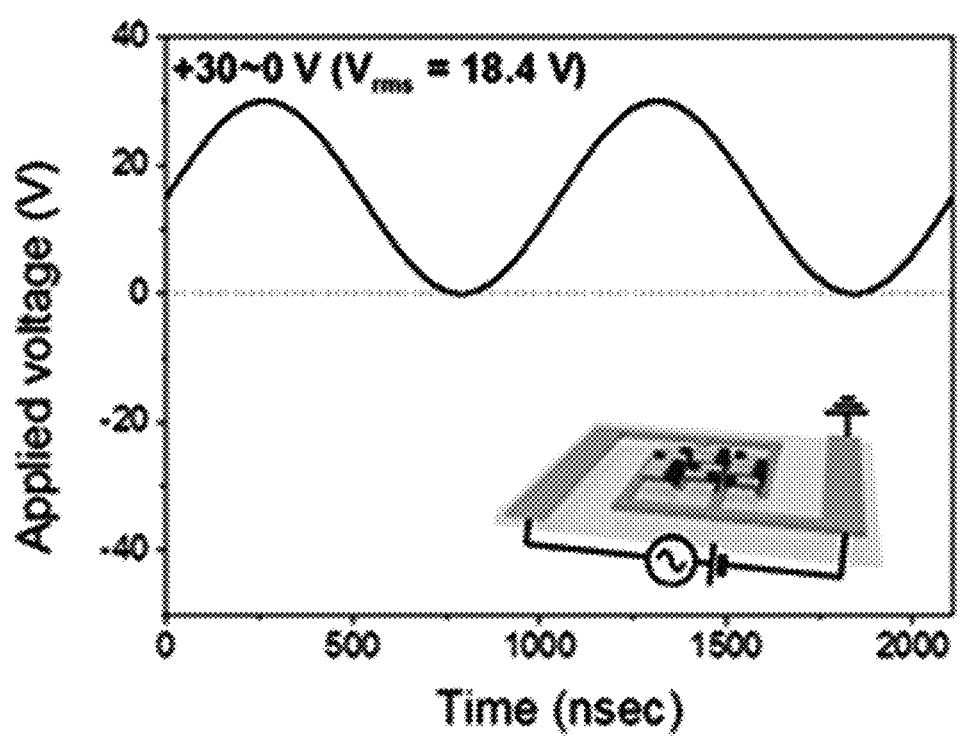
FIG. 8 is a graph illustrating assembly power applied when an ultra-small LED electrode assembly according to one embodiment of the present invention is implemented.

After 9 μl of the solution was dropped onto the electrode line 8 times, the ultra-small LED devices were self-aligned by applying power of a sine wave having 0 to +30 V and a frequency of 950 kHz, as illustrated in FIG. 8, to the mounting electrodes as assembly power.

Heat treatment was then performed to improve contact between the ultra-small LED devices and the electrode line. The heat treatment was performed at a pressure of $5.0 \times 10^{-1}$ torr in a nitrogen atmosphere and at a temperature of 810° C. for 2 minutes, and electroless plating using a 0.05 mM gold solution and copper foil was then performed twice at room temperature for 10 minutes. The heat treatment was performed again on gold nanoparticles, which were adhered between the electrode line and the ultra-small LED device by electroless plating being performed under the same conditions as in the above heat treatment, such that electrical contact therebetween was improved, and the ultra-small LED electrode assembly illustrated in the following Table 2 was prepared.

TABLE 1

| | Material | Length (μm) | Diameter (μm) |
|---|---|---|---|
| First Electrode Layer | Chrome | 0.03 | 0.5 |
| First Conductive Semiconductor Layer | n-GaN | 2.14 | 0.5 |
| Active Layer | InGaN | 0.1 | 0.5 |
| Second Conductive Semiconductor Layer | p-GaN | 0.2 | 0.5 |

TABLE 1-continued

| | Material | Length (μm) | Diameter (μm) |
|---|---|---|---|
| Second Electrode Layer | Chrome | 0.03 | 0.5 |
| Insulating Film | Aluminum oxide | | 0.02 μm Thickness |
| Ultra-small LED Device | — | 2.5 | 0.52 |

Examples 2 and 3

Ultra-small LED electrode assemblies in Examples 2 and 3 were prepared in the same manner as in Example 1, but the assembly power applied to the mounting electrodes was applied to the mounting electrodes as power of a sine wave having a voltage and cycle illustrated in the following Table 2, the ultra-small LED devices were self-aligned, and the ultra-small LED electrode assemblies illustrated in the following Table 2 were prepared.

Comparative Examples 1 to 3

Ultra-small LED electrode assemblies in Comparative Examples 1 to 3 were prepared in the same manner as in Example 1, but the assembly power applied to mounting electrodes was applied to the mounting electrodes as power of a sine wave having a voltage and cycle illustrated in the following Table 2, the ultra-small LED devices were self-aligned, and the ultra-small LED electrode assemblies illustrated in the following Table 2 were prepared.

Experimental Example

The following physical properties with respect to the ultra-small LED electrode assemblies prepared according to the above examples and comparative examples were measured, and evaluation results of the physical properties are illustrated in the following Table 2.

1. Measurement of Total Number of Ultra-Small LED Devices Mounted on Ultra-Small LED Electrode Assembly The ultra-small LED electrode assembly was photographed with an optical microscope to count the number of ultra-small LED devices having both ends coming into contact with two different electrodes.

2. Number and Ratio of Ultra-Small LED Devices Mounted to have Unidirectional Orientation In order to measure the number of ultra-small LED devices which are mounted such that the first conductive semiconductor layer of each of the ultra-small LED devices comes into contact with the first mounting electrode among all of the mounted ultra-small LED devices, the ultra-small LED electrode assembly was driven by DC power of +21.2 V without a waveform and a cycle to count the number of ultra-small LED devices which emitted light. A ratio of the counted number of ultra-small LED devices which emitted light with respect to all of the mounted ultra-small LED devices counted as a result of the above measurement of the physical properties was calculated as a percentage.

3. Visual Evaluation of Light Emitting Intensity

Figure 1B:
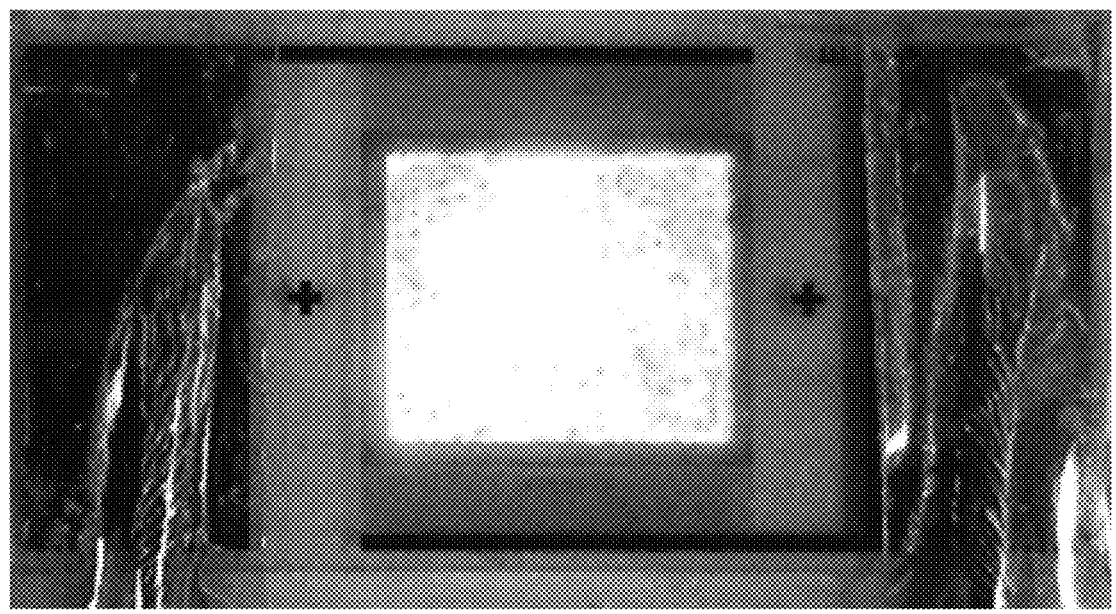
Figure 1C:
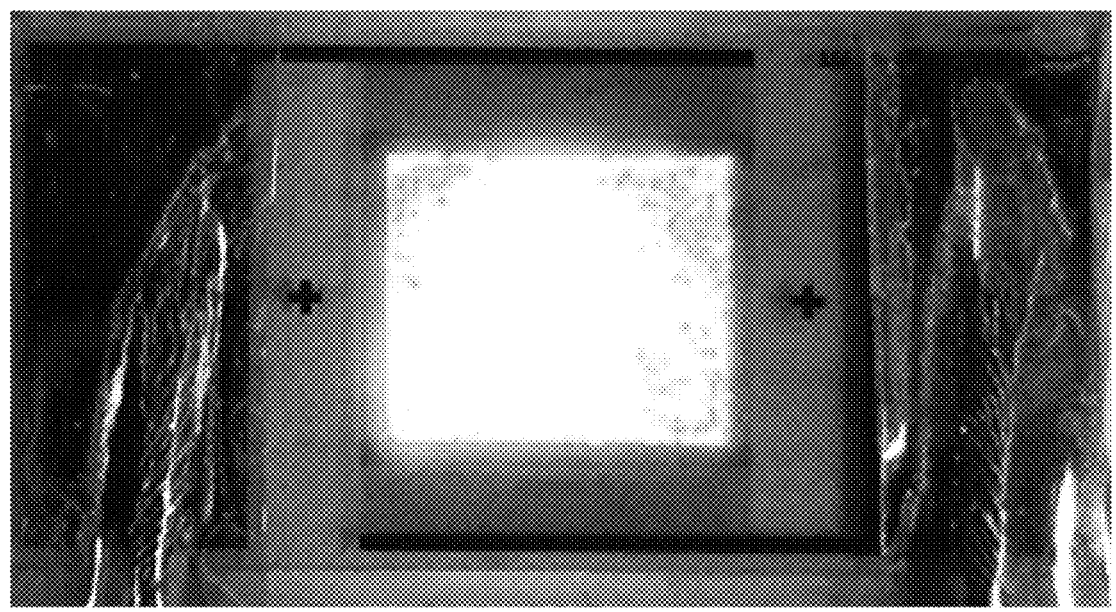
Figure 7A:
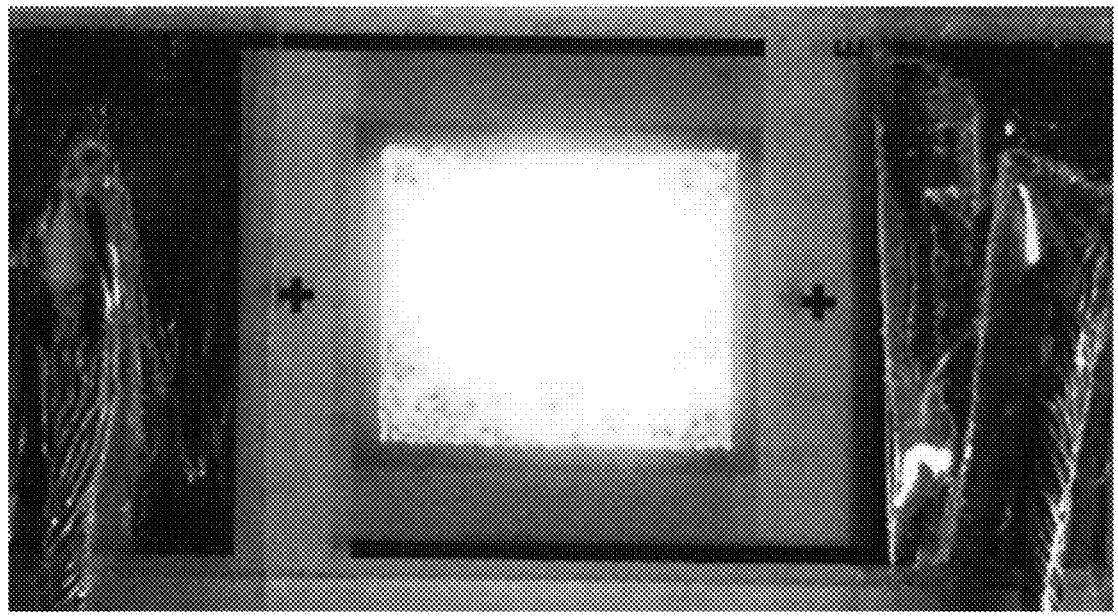
Figure 7B:
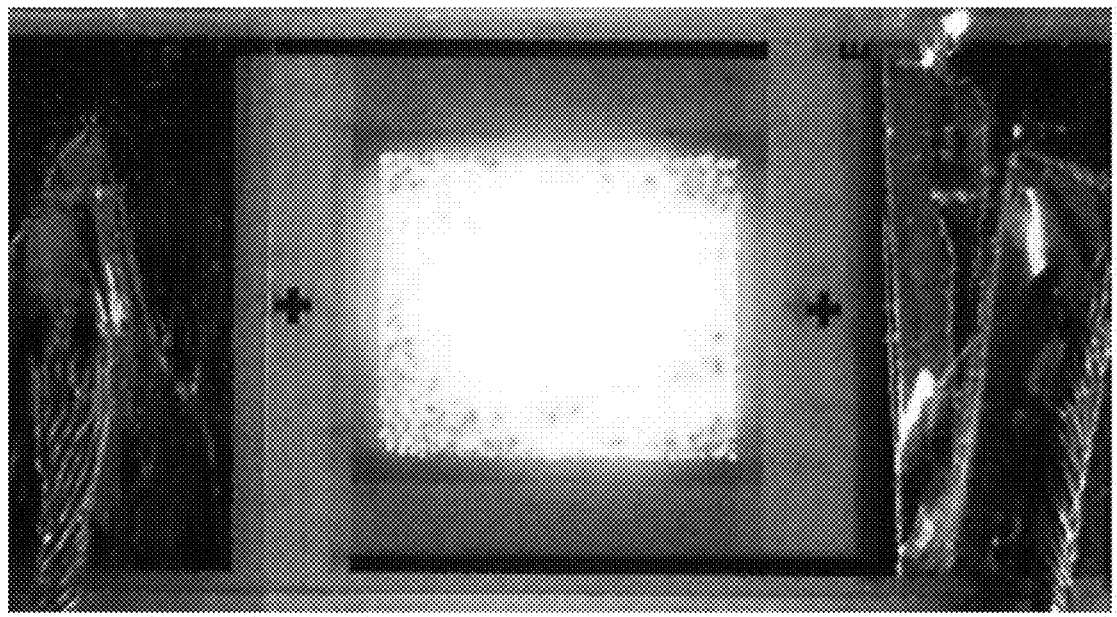

A light emission photograph was taken by primarily applying AC power of a sine wave having 21.2 $V_{rms}$ and a frequency of 60 Hz to each of the ultra-small LED electrode assemblies, and a light emission photograph was taken by secondarily applying AC power of 21.2 V without a waveform and a cycle thereto to drive each of the ultra-small LED electrode assemblies. As a result of the photographing, the luminescence photograph of the primary driving according to Example 1 is illustrated in FIG. 1B and the luminescence photograph of the secondary driving is illustrated in FIG. 1C. The luminescence photograph of the primary driving according to Example 2 is illustrated in FIG. 7A and the luminescence photograph of the secondary driving is illustrated in FIG. 7B. In addition, the luminescence photograph of the primary driving according to Comparative Example 1 is illustrated in FIG. 2B and the luminescence photograph of the secondary driving is illustrated in FIG. 2C.

Specifically, when looking at the luminescence photographs with the naked eye, in Examples 1 and 2, it can be confirmed that degrees of light emission were similar to each other in the primary driving (AC) and the secondary driving (DC) or that light emitted in the secondary driving was slightly brighter than in the primary driving. However, in Comparative Example 1, it can be visually confirmed that light emitted in the primary driving (AC) was much brighter than in the secondary driving (DC) and a luminance was not very good in the secondary driving (DC).

4. Measurement of Luminance and Peak Intensity

A luminance and a peak intensity were measured with a spectrophotometer by primarily applying AC power of a sine wave having a frequency of 21.2 Vim, and 60 Hz to each of the ultra-small LED electrode assemblies, and a luminance and a peak intensity were measured with a spectrophotometer by secondarily applying DC power of 21.2V without having a waveform and a cycle thereto to drive each of the ultra-small LED electrode assemblies. An area value Sum % on an electroluminescence spectrum and an intensity ratio peak % of light having a maximum intensity in each of the examples and comparative examples were calculated. In this case, the area value and the intensity ratio in the secondary driving (DC) in each of the examples and comparative examples are relatively illustrated on the basis of the area value and the intensity ratio in the primary driving (AC).

TABLE 2

| | | Example 1 | Example 2 | Example 3 | Comparative Example 1 | Comparative Example 2 | Comparative Example 3 |
|---|---|---|---|---|---|---|---|
| Ultra-small LED Electrode Assembly | Application Power (Assembly Power) for Self-alignment | 0 V~30 V 950 kHz | 0 V~13 V 950 kHz | +30 V~−10 V 950 kHz | −30 V~+30 V 950 kHz | 0 V~8 V 950 kHz | +30 V~−22 V 950 kHz |
| | Asymmetric Assembly Voltage (V) in Equation 1 | 30 | 13 | 20 | 0 | 8 | 8 |
| | Effective Voltage of Assembly Power ($V_{rms}$, V) | 18.4 | 8.0 | 17.3 | 21.2 | 4.9 | 18.8 |

TABLE 2-continued

|  |  | Example 1 | Example 2 | Example 3 | Comparative Example 1 | Comparative Example 2 | Comparative Example 3 |
|---|---|---|---|---|---|---|---|
|  | Total Number of Mounted Ultra-small LED Device | 88,150 | 59,011 | 71.185 | 166,517 | 20,615 | 90,891 |
|  | Number of Uni-directionally Oriented Ultra-small LED Devices | 78,910 | 36,189 | 57,161 | 81,005 | 9,615 | 44,446 |
|  | Uni-directionally Oriented Ultra-small LED Device Ratio (%) | 89.5 | 61.3 | 80.3 | 48.6 | 46.6 | 48.9 |
| Primary Driving (AC) | Sum % | 1.0 | 1.0 | 1.0 | 1.0 | 1.0 | 1.0 |
|  | Peak % | 1.0 | 1.0 | 1.0 | 1.0 | 1.0 | 1.0 |
| Secondary Driving (DC) | Sum % | 1.43 | 1.12 | 1.31 | 0.51 | 0.81 | 0.97 |
|  | Peak % | 1.47 | 1.19 | 1.34 | 0.52 | 0.83 | 0.99 |

As can be seen in the above Table 2, in the ultra-small LED electrode assembly according to Comparative Example 1, it can be confirmed that the intensity of the light emitted when the DC power was used as driving power was only 0.51 times the intensity of the light emitted when the AC power was used as the driving power based on the entire wavelength, and the peak intensity (peak %) of the light when the DC power was used was only 0.52 times the peak intensity (peak %) of the light when the AC power was used.

However, in Examples 1 and 2, it can be confirmed that a more improved luminance was exhibited when the DC power was used as the driving power in comparison to when the AC power was used as driving power. In Example 1, it can be confirmed that the luminance was increased to be 1.43 times the luminance when the AC power was used as driving power and the peak intensity was increased to be 1.47 times the peak intensity when the AC power was used as driving power due to the use of the DC driving power.

According to the present invention, since an ultra-small LED device is two-dimensionally connected to an electrode line, light, which is blocked by an electrode and cannot be extracted, is minimized, the ultra-small LED device is connected to an ultra-small electrode without a defect such as an electrical short-circuit or the like, and thus an excellent luminance can be exhibited. Also, since a selection limitation of driving power of an ultra-small LED electrode assembly is removed, a luminance characteristic can be sufficiently exhibited even through DC driving power, and the luminance characteristic can be further improved through the DC driving power. Furthermore, since an intensity of light corresponding to a specific wavelength included in an LED itself is further improved, an intensity of light of a converted color significantly increases even when the light is converted into light of a color having another wavelength using the above characteristic. Therefore, the ultra-small LED electrode assembly can be widely used in various lighting apparatuses and can be applied to electronic appliances and various parts such as a liquid-crystal display (LCD) BLU and the like in which an ultra-small LED device is used.

While the present invention has been described with reference to the exemplary embodiments thereof, the spirit of the present invention is not limited to the embodiments presented in this specification. Those skilled in the art, who understands the spirit of the present invention, may easily suggest other embodiments by adding, changing, deleting, or the like elements within the scope of the same concept, and the other embodiments may also be within the spirit of the present invention.

What is claimed is:

1. An LED electrode assembly comprising:
    a lower layer;
    a first electrode on the lower layer and extending in a first direction;
    a second electrode extending in the first direction and spaced from the first electrode in a second direction intersecting the first direction;
    a third electrode on the lower layer, the third electrode comprising:
        a first portion spaced from the first electrode and extending in the first direction;
        a second portion extending in the first direction and located between the first electrode and the second electrode; and
        a third portion extending in the second direction and connecting the first portion and the second portion;
    LED elements between the third electrode and the first electrode or the second electrode;
    an optical layer on the lower layer; and
    an upper cover layer on the optical layer and surrounding a center portion of the optical layer,
    wherein each of the LED elements comprises a first end portion contacting the first electrode or the second electrode, and a second end portion contacting the first portion or the second portion of the third electrode.

2. The LED electrode assembly of claim 1, wherein a side surface of the first end portion of each of the LED elements is in contact with the first electrode or the second electrode, and
    wherein a side surface of the second end portion of each of the LED elements is in contact with the first portion or the second portion of the third electrode.

3. The LED electrode assembly of claim 1, wherein each of the LED elements comprises
    a first semiconductor layer;
    a second semiconductor layer; and
    an active layer between the first semiconductor layer and the second semiconductor layer.

4. The LED electrode assembly of claim 3, wherein the LED elements comprise:
    a first LED element having the first end portion in contact with the first electrode and the second end portion in contact with the first portion of the third electrode; and a second LED element having the first end portion in contact with the second electrode and the second end portion in contact with the second portion of the third electrode.

5. The LED electrode assembly of claim 4, wherein the first end portion of the first LED element is a portion adjacent to the first semiconductor layer,
wherein the second end portion of the first LED element is a portion adjacent to the second semiconductor layer,
wherein the first end portion of the second LED element is a portion adjacent to the second semiconductor layer, and
wherein the second end portion of the second LED element is a portion adjacent to the first semiconductor layer.

6. The LED electrode assembly of claim 5, wherein the first electrode comprises a first extending portion extending in the first direction and in contact with at least one of the LED elements, and a first bending portion extending in the second direction and not in contact with any of the LED elements, and
wherein the second electrode comprises a second extending portion extending in the first direction and in contact with at least one of the LED elements, and a second bending portion extending in the second direction and not in contact with any of the LED elements.

7. The LED electrode assembly of claim 4, wherein the first end portion of the first LED element is a portion adjacent to the second semiconductor layer,
wherein the second end portion of the first LED element is a portion adjacent to the first semiconductor layer,
wherein the first end portion of the second LED element is a portion adjacent to the first semiconductor layer, and
wherein the second end portion of the second LED element is a portion adjacent to the second semiconductor layer.

8. The LED electrode assembly of claim 1, further comprising electrode lines spaced from each other and extending in the second direction,
wherein the LED elements are located between the electrode lines, and
wherein the first electrode and the second electrode are electrically connected to at least one of the electrode lines.

9. The LED electrode assembly of claim 1, wherein at least some of the LED elements are in contact with the lower layer, and wherein at least a portion of the first electrode, the second electrode and the third electrode is in contact with the lower layer.

10. A display device comprising:
a lower layer on a first substrate;
a first electrode on the lower layer and extending in a first direction;
a second electrode extending in the first direction and spaced from the first electrode in a second direction intersecting the first direction;
a third electrode disposed on the lower layer, the third electrode comprising:
a first portion spaced apart from the first electrode and extending in the first direction;
a second portion extending in the first direction and located between the first electrode and the second electrode; and
a third portion extending in the second direction and connecting the first portion and the second portion;
LED elements between the third electrode and the first electrode or the second electrode;
an optical layer on the lower layer; and
an upper cover layer on the optical layer, and surrounding a center portion of the optical layer,
wherein each of the LED elements comprises a first end portion contacting the first electrode or the second electrode, and a second end portion contacting the first portion or the second portion of the third electrode.

11. The display device of claim 10, wherein a side surface of the first end portion of each of the LED elements is in contact with the first electrode or the second electrode, and
wherein a side surface of the second end portion of each of the LED elements is in contact with the first portion or the second portion of the third electrode.

12. The display device of claim 10, wherein at least some of the LED elements are in contact with the lower layer, and
wherein at least a portion of the first electrode, the second electrode and the third electrode is in contact with the lower layer.

13. The display device of claim 10, wherein each of the LED elements comprises:
a first semiconductor layer;
a second semiconductor layer; and
an active layer between the first semiconductor layer and the second semiconductor layer.

14. The display device of claim 10, further comprising a support substrate below the first substrate.

* * * * *